(12) United States Patent
Adrain

(10) Patent No.: US 6,801,262 B2
(45) Date of Patent: Oct. 5, 2004

(54) VARIABLE DELAY CHANNEL SCAN

(76) Inventor: John B. Adrain, 1730 Kearny, No. 2G, San Francisco, CA (US) 94133

( * ) Notice: Subject to any disclaimer, the term of this patent is extended or adjusted under 35 U.S.C. 154(b) by 415 days.

(21) Appl. No.: 09/897,288

(22) Filed: Jul. 2, 2001

(65) Prior Publication Data

US 2003/0013424 A1 Jan. 16, 2003

(51) Int. Cl.[7] .................................................. H04N 5/50
(52) U.S. Cl. ........................................ 348/732; 348/731
(58) Field of Search ............................... 348/731, 732, 348/733, 734, 553, 569, 564, 565; H04N 5/50, 5/44

(56) References Cited

U.S. PATENT DOCUMENTS

| | | | |
|---|---|---|---|
| 3,778,721 A | * | 12/1973 | Moran ...................... 455/172.1 |
| 4,220,973 A | * | 9/1980 | Macchetta ................... 348/732 |
| 4,556,987 A | | 12/1985 | Schlösser et al. |
| 5,073,975 A | | 12/1991 | Zarabadi et al. |
| 5,101,197 A | * | 3/1992 | Hix et al. ...................... 345/87 |
| 5,144,438 A | | 9/1992 | Kim |
| 5,161,253 A | | 11/1992 | Hirano |
| 5,210,611 A | | 5/1993 | Yee et al. |
| 5,247,365 A | * | 9/1993 | Hakamada et al. ......... 348/732 |
| 5,251,034 A | | 10/1993 | Na |
| 5,371,550 A | | 12/1994 | Shibutani et al. |
| 5,673,089 A | | 9/1997 | Yuen et al. |
| 5,886,746 A | | 3/1999 | Yuen et al. |
| 6,112,064 A | | 8/2000 | Arrowsmith et al. |
| 6,198,513 B1 | * | 3/2001 | Cherrick ..................... 348/731 |

\* cited by examiner

Primary Examiner—Michael H. Lee
(74) Attorney, Agent, or Firm—Pearne & Gordon LLP

(57) ABSTRACT

Channel changing apparatus for automatically scanning or incrementing the channel on a radio, television or other receiver and pausing for a set period of time on each channel to allow a user to preview to content. A scan speed adjustment control allows the user to vary the length of the preview period. The channel changing apparatus may be provided on a remote control device or integral to the receiver.

14 Claims, 2 Drawing Sheets

VARIABLE DELAY CHANNEL SCAN

BACKGROUND OF THE INVENTION

1. Field of the Invention

This invention relates to channel selection on a radio or television and in particular to a variable delay automatic channel scanning function.

2. Description of the Related Art

Televisions and AM/FM radios are known to have an automatic "scan" feature which allows the user to preview each available television channel or radio station for a predetermined period. After the period has elapsed, the television or radio receiver is incremented to the next channel in a list or to the next detected station having a sufficiently strong signal. When the user finds content of interest in the presently selected channel or station, the scanning operation may be halted by operating a control.

Usually, the period of time for which the receiver is delayed before incrementing the channel is fixed. Depending upon the length of the fixed period, the viewing or listening habits of a particular user, and the type of content, the fixed period may be inappropriate or inconvenient. If the period is too brief, the user may not have enough time to appreciate the content and stop the scanning. Likewise, if the period is too long, the scanning operation may become cumbersome.

U.S. Pat. No. 5,886,746 to Yuen et al. discloses a method for channel scanning in which it is possible for the user to program the period of time that a channel is displayed before another channel is displayed to either of two preset periods: five seconds or 15 seconds.

BRIEF SUMMARY OF THE INVENTION

A channel changing apparatus for a radio or television receiver comprising a receiver for receiving a plurality of channels is provided. The channel changing apparatus further comprises an automatic channel scan for causing the receiver to select a first one of the plurality of channels and to select a second one of the plurality of channels after a set scan period has elapsed, and a scan speed adjustment for selectively setting the scan period.

DETAILED DESCRIPTION OF THE INVENTION

Figure 1:
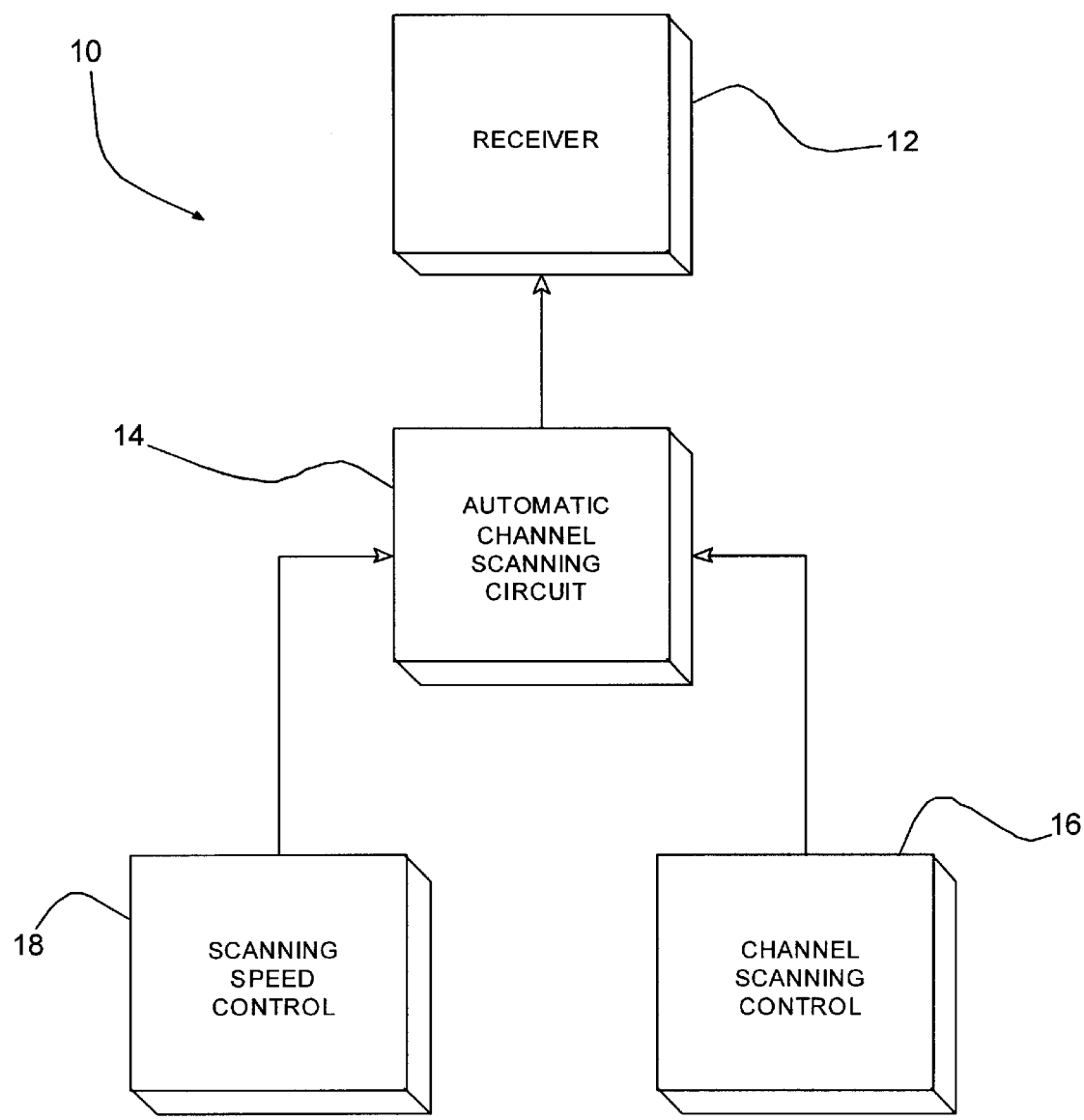
FIG. 1 is a schematic view of a channel changing apparatus in accordance with one embodiment of the invention.

FIG. 1 is a schematic representation of a channel changing apparatus 10 embodying a variable delay channel scan in accordance with one embodiment of the invention. The apparatus 10 comprises an automatic channel scanning circuit 14 which controls the changing of channels on a receiver 12, such as a radio or television receiver.

When activated, the scanning circuit 14 causes the receiver 12 to scan, that is, increment or decrement, through a list of channels or frequencies at a specific interval or speed. The list can be selected by the user or include all detected stations having a sufficiently strong signal. This allows a user to preview each channel for the set time period, as determined by the interval, before the scanning circuit 14 causes the receiver 12 to increment or decrement to the next channel in the list. The scanning circuit 14 can scan in either a forward or a reverse direction. The speed can be increased or decreased within a given range. For example, the delay or pause time at each station can be selected within a range of 0.5 to 10 seconds. The delay can be set over a continuous range, such that it is continuously variable. As used herein, the term continuously variable refers to the ability to be set to any of an infinite number of values within a given range, or the substantial appearance of such.

The scanning circuit 14 is controlled by a channel scanning control 16 and a scanning speed control 18. The scanning control 16 allows the user to selectively initiate and discontinue scanning in either the forward or reverse direction by the scanning circuit 14. Once initiated, scanning continues in the selected direction until the user directs the scanning control 16 to discontinue the operation of the scanning circuit 14.

The speed control 18 allows the user to control the speed at which the channel scanning circuit 14 scans through the channels of the receiver 12. Selecting a higher speed decreases the set time period between incrementing or decrementing operations. Similarly, selecting a lower speed increases the period. The speed may be adjusted at any time, including during scanning, in order to speed up or slow down the scanning.

Figure 2:
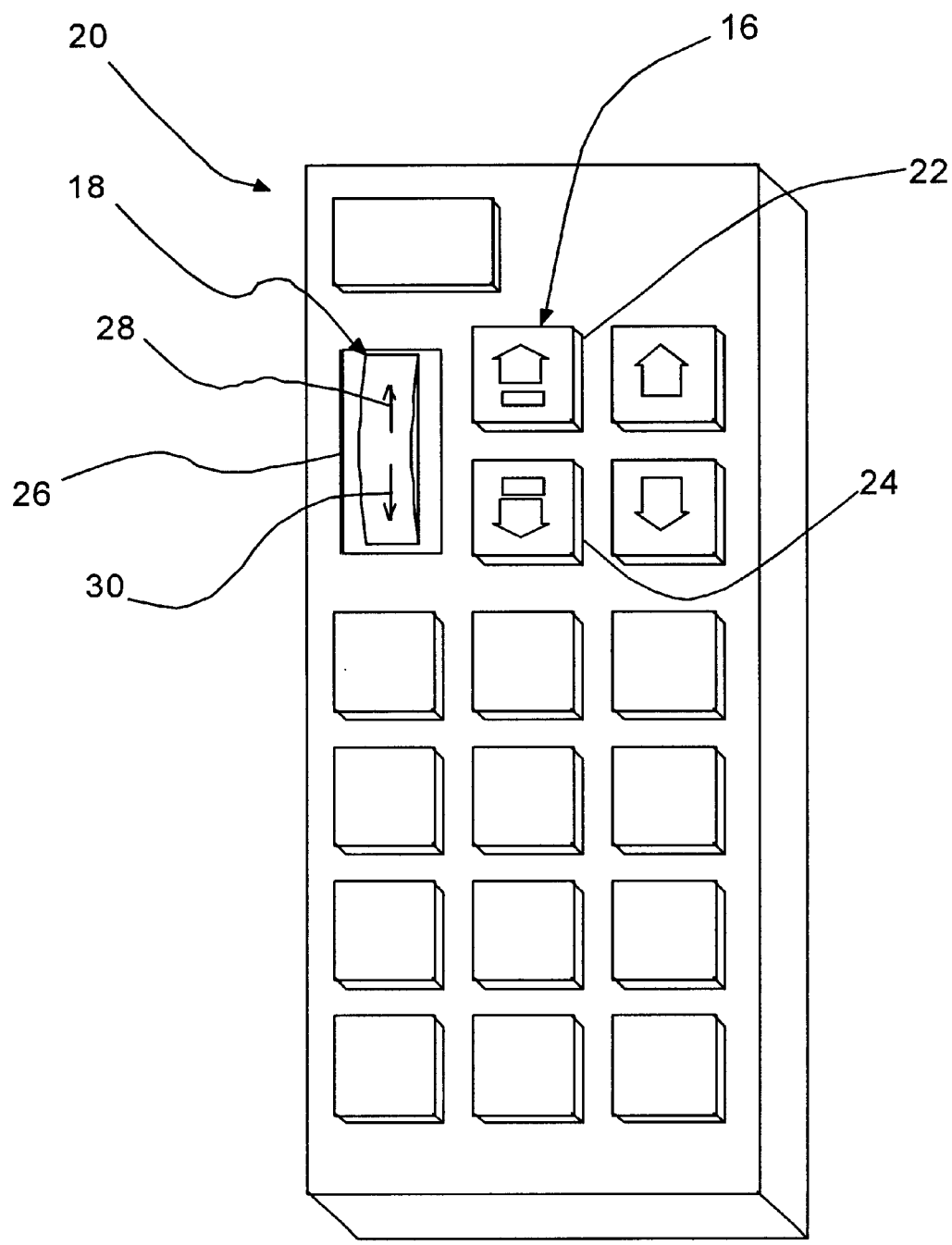
FIG. 2 is a plan view of a remote control device embodying the channel changing apparatus in accordance with one embodiment of the invention.

In FIG. 2, a remote control device 20 is shown which partially embodies the present invention. In this embodiment, the channel scanning control 16 comprises a forward scan button 22 and a reverse scan button 24. In an initial or inactive state, pressing the forward scan button 22 causes the scanning circuit 14 to begin incrementing the channels of the receiver 12 in a forward direction, pausing for the set period on each channel. Pressing the forward scan button 22 again, or pressing the reverse scan button 24, causes the scanning circuit 14 to discontinue scanning. Likewise, pressing the reverse scan button 24 from the inactive state causes the scanning circuit 14 to begin scanning in the reverse direction. This reverse scanning operation can also be stopped by pressing either scan button 22, 24. It should be appreciated that other known control means can be substituted for the scan buttons 22, 24, such as a toggle switch or a single button.

In the embodiment of FIG. 2, the scanning speed control 18 comprises a thumb wheel 26. Rolling the thumbwheel 26 in a forward direction 28 selectively increases the scanning speed, thereby decreasing the set period, up to a maximum speed (or a minimum period). Rolling the thumbwheel 26 in a reverse direction 30 selectively decreases the scanning speed, thereby increasing the set period, down to a minimum speed (or up to a maximum period length). It should be appreciated that other known control means can be substituted for the thumb wheel 26, such as a turn knob, a pair of increase and decrease buttons, a toggle switch, or a sliding selector. An additional alternative would be to provide a means for entering a numeric value for the period length using a keypad.

Further, while the invention has been described with reference to specific embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed for carrying out this invention, but that the invention will include all embodiments falling within the scope of the appended claims.

What is claimed is:

1. A channel changing apparatus for a radio or television receiver comprising:

a receiver for receiving a plurality of channels;

an automatic channel scan for causing the receiver to select a first one of the plurality of channels and to select a second one of the plurality of channels after a set scan period has elapsed;

a scan speed adjustment for selectively setting the scan period.

2. The channel changing apparatus of claim 1, wherein the scan period can be adjusted to any of an infinite number of values over a predetermined range.

3. The channel changing apparatus of claim 1, wherein the scan speed adjustment comprises at least three discrete scan periods to which the scan period can be selectively set.

4. The channel changing apparatus of claim 1, further comprising a remote control device comprising the scan speed adjustment.

5. The channel changing apparatus of claim 1, wherein the automatic channel scan comprises a first mode for selecting channels in a first order and a second mode for selecting channels in a second order.

6. The channel changing apparatus of claim 1, wherein the receiver comprises a radio receiver.

7. The channel changing apparatus of claim 1, wherein the receiver comprises a television receiver.

8. The channel changing apparatus of claim 1, wherein the scan speed may be adjusted during the operation of the automatic channel scan.

9. A remote control device for controlling a television or radio receiver, comprising:

an automatic channel scanning circuit comprising a set scan period affecting a scanning speed;

a channel scanning control operatively connected to the automatic channel scanning circuit;

a scanning speed control operatively connected to automatic channel scanning circuit.

10. The remote control device of claim 9, wherein the scanning speed control comprises a thumb wheel.

11. The remote control device of claim 9, wherein the scanning speed control comprises a speed increase button and a speed decrease button.

12. The remote control device of claim 9, wherein the channel scanning control comprises a button.

13. The remote control device of claim 9, wherein the channel scanning control comprises a sliding selector.

14. A method for changing the channels of a radio or television receiver, comprising steps of:

selectively setting a scan speed;

initiating a channel scan;

pausing for a scan period determined by the set scan speed; and automatically incrementing or decrementing a channel setting of the receiver after completing the step of pausing.

* * * * *